United States Patent [19]
Ma et al.

[11] Patent Number: 6,067,244
[45] Date of Patent: May 23, 2000

[54] FERROELECTRIC DYNAMIC RANDOM ACCESS MEMORY

[75] Inventors: Tso-Ping Ma, Branford; Jin-Ping Han, New Haven, both of Conn.

[73] Assignee: Yale University, New Haven, Conn.

[21] Appl. No.: 09/154,056

[22] Filed: Sep. 16, 1998

Related U.S. Application Data

[60] Provisional application No. 60/061,859, Oct. 15, 1997.

[51] Int. Cl.[7] .................................................. G11C 11/22
[52] U.S. Cl. ............................ 365/145; 365/149; 365/222
[58] Field of Search ..................................... 365/145, 222, 365/149

[56] References Cited

U.S. PATENT DOCUMENTS

| | | | |
|---|---|---|---|
| 3,832,700 | 8/1974 | Wu et al. ............................... | 340/173 R |
| 4,655,550 | 4/1987 | Crossland et al. ......................... | 345/97 |
| 4,788,082 | 11/1988 | Schmitt ................................. | 427/248.1 |
| 5,029,128 | 7/1991 | Toda ...................................... | 365/145 |
| 5,109,357 | 4/1992 | Eaton, Jr. ............................... | 365/145 |
| 5,198,994 | 3/1993 | Natori ................................... | 365/145 |
| 5,307,305 | 4/1994 | Takasu ................................... | 365/145 |
| 5,345,414 | 9/1994 | Nakamura ............................... | 365/145 |
| 5,373,462 | 12/1994 | Achard et al. ........................... | 365/145 |
| 5,528,535 | 6/1996 | Honjo et al. ............................ | 365/145 |
| 5,686,745 | 11/1997 | Lin et al. ................................ | 257/295 |
| 5,715,190 | 2/1998 | Honjo et al. ............................ | 365/149 |
| 5,737,261 | 4/1998 | Taira ..................................... | 365/149 |
| 5,768,176 | 6/1998 | Katoh .................................... | 365/145 |
| 5,768,185 | 6/1998 | Nakamura et al. ................ | 365/185.01 |
| 5,822,239 | 10/1998 | Ishihara et al. ......................... | 365/149 |

OTHER PUBLICATIONS

Xiewen Wang et al., "Highly Reliable Silicon Nitride Thin Films Made by Jet Vapor Deposition", J. Appl. Phys., vol. 34, 1995, pp. 956–959.

Michael J. Zulich, "DRAM: The Next Generation", Originally published in *Computer Shopper*, Jun. 1997, pp. 1–5.

*Primary Examiner*—David Nelms
*Assistant Examiner*—Hoai V. Ho
*Attorney, Agent, or Firm*—Fish & Richardson P.C.

[57] ABSTRACT

A memory including an array of memory cells, each of which includes a ferroelectric field effect transistor (FET) as its memory element; and sense and refresh circuitry connected to the array of memory cells to read stored data within each cell by sensing source-to-drain conductivity of the ferroelectric transistor and to refresh the stored data.

14 Claims, 9 Drawing Sheets

FERROELECTRIC DYNAMIC RANDOM ACCESS MEMORY

This application claims the benefit under 35 U.S.C. § 119(e)(1) of U.S. provisional application Ser. No. 60/061,859, filed Oct. 14, 1997.

BACKGROUND OF THE INVENTION

The invention relates to dynamic random access memory (DRAM).

Random access memory (RAM) falls generally into two categories, namely, static and dynamic. Both types of RAM are made up of an array of addressable storage cells, each one storing a bit of information (or multi-bit information). In static RAM (SRAM), the storage unit within the cell is typically a bi-stable flip-flop and the state of the flip-flop indicates whether the cell stores a zero or a one. In dynamic RAM (DRAM) the storage unit is typically an IC capacitor and the charge on the capacitor indicates whether the stored value is either a zero or a one. In the case of DRAM's, however, capacitors gradually lose charge and thus it is necessary to "refresh" the stored data as often as every few milliseconds (though in more recent DRAM that has been increased to on the order of hundreds of milliseconds and even seconds). The refreshing operation is performed by first reading the value in the cell and then writing it back. This is done for every cell in the array and it typically requires complicated control circuitry.

The earliest DRAM cell, introduced in the early 70's, contained four transistors. Later, 3-transistor DRAM cells were introduced, which made the cell size smaller and memory density higher. Shortly after, the 1-transistor/1-capacitor cell was introduced, which wiped out all its competitors because of its simplicity as well as its small cell size, and has remained an industry standard. Over the years, through the 4K, 16K, 64K, and 256K DRAM generation, the cell size was reduced by shrinking both the transistor and the capacitor dimensions, and it was easier to shrink the capacitor than the transistor because of the former's simplicity. Starting from the 1 Mb DRAM generation in the mid 1980's, however, the situation has reversed, because the capacitor has been forced to assume a more and more complicated 3-dimensional structure to live within the "real estate" area allocated for a given cell size. It is safe to say that the most costly part of the DRAM cell, including the R&D efforts and the production cost, is, and will continue to be into the foreseeable future, the capacitor. And it may very well be the show stopper against continued scaling somewhere down the line, unless a new DRAM cell design is adopted which can live without the capacitor.

SUMMARY OF THE INVENTION

The present invention is a new DRAM cell design which uses a ferroelectric MOS transistor as the storage unit. We refer to this new DRAM as a FEDRAM which is short for FErroelectric DRAM). The FEDRAM cell eliminates the capacitor in the 1-transistor/1-capacitor cell, and retains the cell's transistor with a slight modification of the gate dielectric. The data retention times for these devices are short in comparison to the requirements for nonvolatile memory, e.g. on the order of minutes or even days. But this limitation is readily overcome with the addition of appropriate refresh circuitry within the FEDRAM chip.

In general, in one aspect, the invention is a memory including an array of memory cells, each of which includes a ferroelectric field effect transistor (FET) as its memory element; and sense and refresh circuitry connected to the array of memory cells to read stored data within each cell by sensing source-to-drain conductivity of the ferroelectric transistor and to refresh the stored data.

In preferred embodiments, the sense and refresh circuitry is programmed to periodically refresh the stored data in the array of memory cells. One way in which this is done is that the said sense and refresh circuitry is programmed to periodically sense the stored data in a selected one of the memory cells and if the sensed data in the selected memory cell has decayed to below a threshold value to automatically refresh the data stored in the selected memory cell. Also, each memory cell in the array of memory cells further includes a select transistor connected to the ferroelectric FET in that memory cell. In each memory cell, the select transistor is connected to a gate of the ferroelectric FET, or either the source and drain of the ferroelectric FET. Further, in each memory cell, the ferroelectric transistor includes a gate dielectric made of ferroelectric material. It may also include one or more additional dieletric layers to form a stacked structure.

In general, in another aspect, the invention is a DRAM including an array of memory cells, each of which includes a ferroelectric field effect transistor (FET) as its memory element, and wherein the DRAM determines a stored value within any given memory cell by sensing source-to-drain conductivity of the corresponding ferroelectric FET.

The FEDRAM cell has other major advantages compared to the conventional DRAM cell. Because the FEDRAM cell does not require a storage capacitor, its size is inherently smaller than the conventional DRAM cell. Thus, higher memory density can be achieved with a given fabrication ground rule. In addition, eliminating the capacitor in the FEDRAM cell makes it a lot easier in comparison to the conventional DRAM cell to further scale down the size of the cell. Also, since the program speed in the FEDRAM cell is limited by the switching time of the ferroelectric thin film, it can be very fast, e.g. on the order of 1 ns or shorter; whereas the program speed in the conventional DRAM cell is slowed down by the charging time of the storage capacitor.

Other advantages are that the readout speed is also improved because of the elimination of the storage capacitor. And a much longer time between refresh can be tolerated, because of the much longer retention time of the FEDRAM cell, as compared to conventional DRAM, e.g. on order of minutes or days vs seconds. Furthermore, the power consumption is lower because of the elimination of the storage capacitor and the reduced refresh requirement.

The FEDRAM represents philosophically a different approach from prior efforts to using ferroelectric (FE) transistors in memory arrays. The approach which has been pursued by others is to find a truly "nonvolatile" FE transistor. But that search has thus far produced no real commercial successes. The present invention solves the problems associated with FE memory transistor technology by relying on a refresh operation. There are major differences, both conceptually and operationally, between the FEDRAM of the present application and the "nonvolatile" FE transistor memory, which has thus far eluded the substantial efforts of researchers. These differences are summarized as follows.

The "nonvolatile" FE memory transistor requires an extremely long memory retention time (typically several years), while the FEDRAM cell only requires a much shorter retention time (on the order of seconds will suffice).

Because of the very stringent "nonvolatility" requirement, practically no leakage current can be tolerated across either the top or the bottom interface of the "nonvolatile" memory cell, or within the FE film itself. Therefore, no one has demonstrated a truly "nonvolatile" FE memory transistor, and it is extremely difficult to manufacture. In contrast, the FEDRAM can tolerate significant amounts of gate leakage current owing to its ability to be refreshed, and thus can be more easily manufactured.

The "nonvolatile" FE memory transistor requires a FE film that is nearly free of defects so that there is practically no ionic current or other charge transport mechanisms that can be induced by the internal polarization. Otherwise, if there is even a tiny amount of current, the movement of charge in the FE film will cause memory loss and circuit failure. In contrast, the FEDRAM can tolerate such currents because of the dynamic nature of the memory cell and the use of the refresh operation in the circuit.

The "nonvolatile" cell cannot tolerate significant disturbances due to either programming or reading of other cells, while the FEDRAM cell is much more tolerant (again due to the built-in refresh operation), and therefore the latter affords much more latitude for circuit design and architecture.

Other advantages and features will become apparent from the following description of the preferred embodiment and from the claims.

BRIEF DESCRIPTION OF THE DRAWINGS

FIGS. 1(a–c) illustrate three enhancement-mode MOS devices which include the ferroelectric film as the gate dielectric;

DESCRIPTION OF THE PREFERRED EMBODIMENT

The new FEDRAM cell includes a field-effect transistor (FET) structure which employs a ferroelectric (FE) film for the gate dielectric and which serves as both the data storage element and its own readout device. The data storage is accomplished by inducing a polarization in a ferroelectric film. This polarization in turn modulates the conductivity of the FET's conduction channel, which can be sensed when one wishes to read out the stored data. Because of the finite retention time of the stored data, a refresh operation is included to maintain the memory, as in the case of all DRAMs.

The FEDRAM Transistor Structure and Its Principle of Operation

Figure 1A:
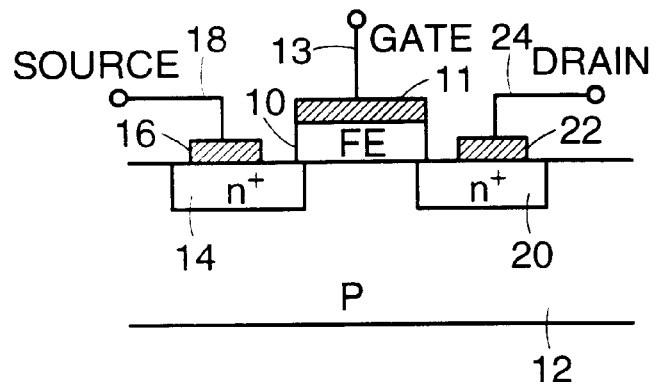
FIG. 1(a) presents a cross-sectional schematic view of a FEDRAM cell in which the gate dielectric is a ferroelectric (FE) film.
Figure 1B:
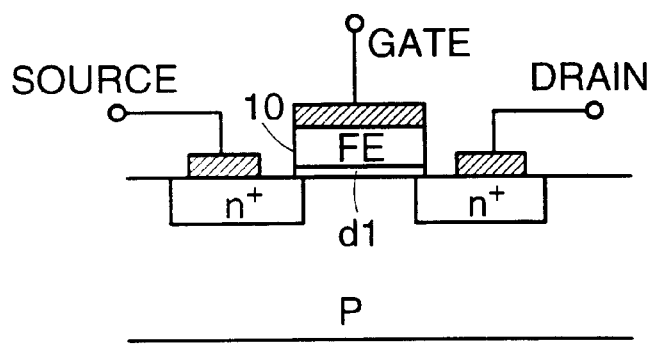
FIG. 1(b) presents a cross-sectional schematic view of a FEDRAM cell in which the gate dielectric includes a ferroelectric (FE) film on top of an ultra-thin buffer dielectric layer, d1.
Figure 1C:
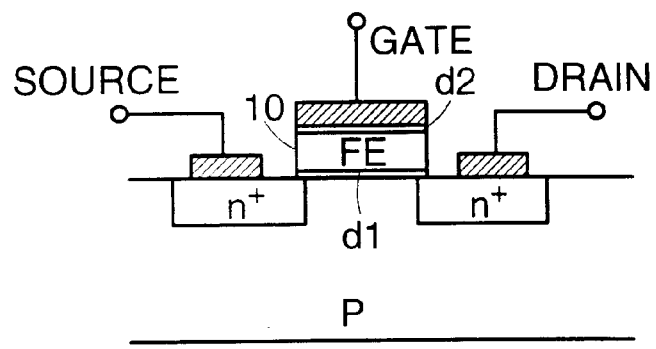
FIG. 1(c) presents a cross-sectional schematic view of a FEDRAM cell in which the gate dielectric includes a ferroelectric (FE) film sandwiched between two ultra-thin buffer dielectric layers, d1 and d2.

As shown in FIGS. 1(a)–(c), the FEDRAM transistor structure is similar to that of a MOSFET (Metal-Oxide-Semiconductor Field-Effect Transistor) except that the gate oxide is replaced by a ferroelectric film 10 (FIG. 1a). In other respects the FEDRAM transistor structure is similar to a conventional MOSFETs. The FEDRAM transistor structures shown in FIGS. 1(a–c) are enhancement mode FETs fabricated on a p-type substrate 12. They include a source region 14 with a source contact 16 and a source terminal 18; a drain region 20 with a drain contact 22 and a drain terminal 24; and on top of FE film 10 there is a gate contact 11 with a gate terminal 13.

In the embodiments shown in FIGS. 1(b–c), the gate oxide is a dielectric stack including of a ferroelectric film 10 plus another dielectric layer, d1 (FIG. 1b), or a dielectric stack including a ferroelectric film 10 plus two other dielectric layers, d1 and d2 (FIG. 1c). In all these structures, both d1 and d2 are sufficiently thin (e.g. <10 nm) that they do not drop significant amount of gate voltage, and significant leakage current may flow through them.

Figure 2A:
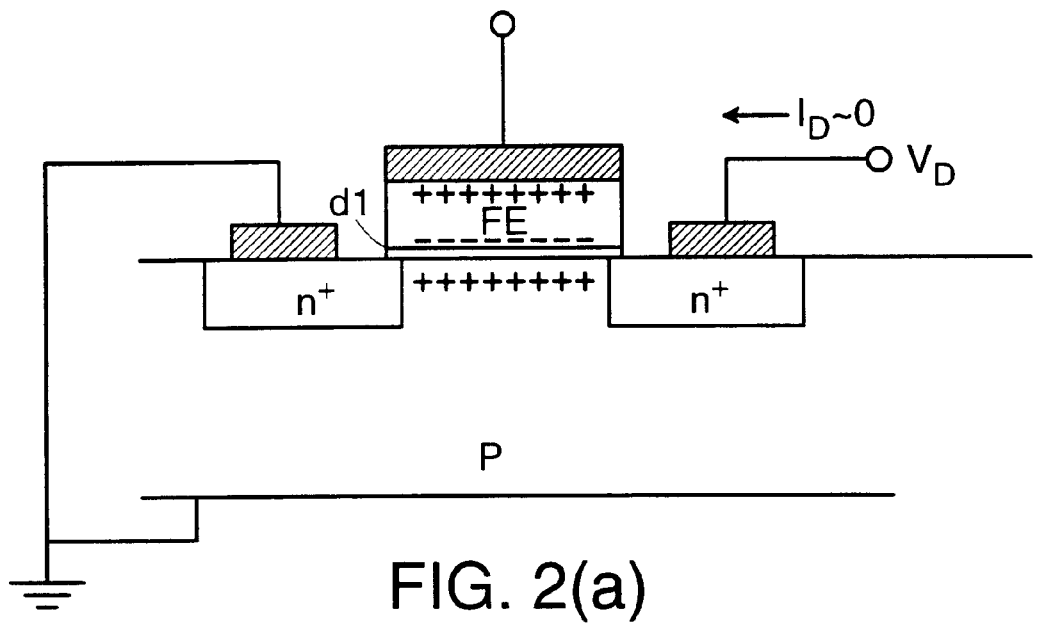
FIG. 2(a) illustrates the zero state of a FEDRAM cell.

The principle of operation of the FEDRAM is as follows. Suppose the ferroelectric film has an initial polarization as shown in FIG. 2(a), and the source-to-drain current, called the drain current, is off (i.e., practically zero). The polarization of the FE film prevents the formation of an inversion layer in the Si conduction channel and thus prevents current from flowing between the source and drain. As the drain current is nearly zero, this may designated as defining the "0" state.

Figure 2B:
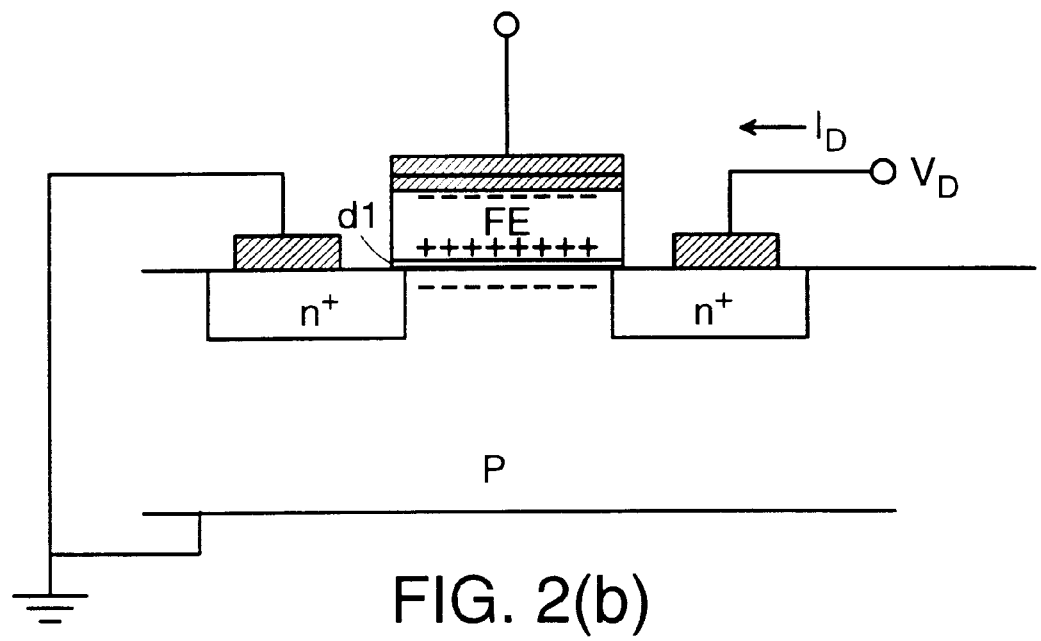
FIG. 2(b) illustrates the "one" state of the FEDRAM cell.

If one applies a positive gate voltage pulse of sufficient amplitude and duration, the polarization of the ferroelectric film will reverse its polarity, as shown in FIG. 2(b). This polarization, if it is sufficiently large, will induce an inversion layer at the semiconductor surface, and significant drain current will flow. This may be called the "1" state, as the drain current becomes significant. Thus, by applying a positive pulse to the gate, we have caused the FEDRAM to switch from state "0" to state "1". Similarly, one can switch the FEDRAM from state "1" to state "0" by applying a negative pulse to the gate.

The memory content of each FEDRAM cell is sensed by reading its drain current at zero gate voltage or at another predetermined gate voltage.

Figure 3A:
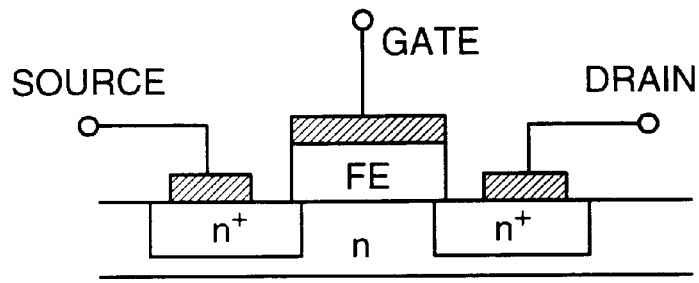
FIGS. 3(a–c) illustrate three depletion-mode MOS devices which are counterparts to the enhancement-mode devices shown in FIGS. 1(a–c)
Figure 3B:
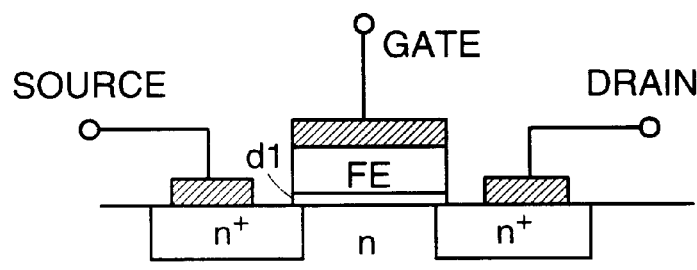
Figure 3C:
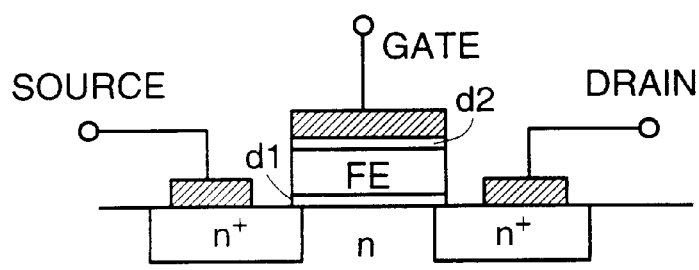

As indicated above, the FEDRAM devices shown in FIGS. 1(a–c) are based on enhancement-mode transistors. One can also fabricate depletion-mode transistors to achieve the same purpose, as shown in FIGS. 3(a)–(c). The material in which the device is formed is an n-type semiconductor that is formed on top of the p-type substrate or on top of an insulator. The principle of operation is similar to the one described above, except that the deice is normally in a conducting state and is turned off by applying an appropriate voltage to the gate.

The three alternative dielectric structures presented in FIGS. 1 and 3 each has its advantages as well as its shortcomings. The dielectric structure of FIGS. 1(a) and 3(a) (i.e., where d1=d2=0) requires the smallest gate pulse to program, but it also is the hardest to fabricate because it is very difficult to avoid the formation of "native" oxide on the semiconductor substrate during the deposition of the ferroelectric film. Without a buffer layer between the ferroelectric film and the underlying semiconductor, it is also difficult to avoid inter-diffusion between elements in the ferroelectric film and the semiconductor, which can either degrade the ferroelectric properties or the transistor characteristics (or both) of the FEDRAM.

The gate dielectric structure shown in FIGS. 1(b) and 3(b) allows a wide range of choices of materials for d1 which satisfy at least the following requirements: (i) d1 must be a good barrier against the interdiffusion between the semiconductor and the ferroelectric; (ii) d1 must form a good electrical interface with the underlying semiconductor; and (iii) d1 does not drop too large a portion of the gate voltage. Compared to the structure shown in FIG. 1(a) or FIG. 3(a), however, the gate dielectric structure in FIG. 1(b) or FIG. 3(b) will require a large gate voltage pulse to program because of the voltage drop across d1, but it provides more process latitude and is more manufacturable.

By the same token, the gate dielectric structure shown in FIG. 1(c) or FIG. 3(c) will require an even larger gate voltage pulse to program, but it should have the longest retention time.

Experimental Results

We have done some experiments to verify the workability of the devices. Results are presented and discussed below.

We made a set of ferroelectric gate stacks on Si to test the feasibility of the FEDRAM transistor. The gate stack test structure, which we shall refer to as the FEDRAM gate, includes a Au gate electrode deposited on a ferroelectric $SrBi_2Ta_2O_9$ (SBT) film, which is deposited on an ultrathin (e.g. ~3 nm thick) silicon oxynitride layer on an n-type Si substrate. The silicon oxynitride layer was deposited on a pre-cleaned n-type Si substrate by a jet-vapor deposition (JVD) procedure that is known and described in the prior art. For example, see M. Khare, et al., 1997 Symposium on VLSI Technology Digest of Technical Papers, P. 51 (1997); Xiewen Wang et al., "Highly Relaible Silicon Nitride Thin Films Made by Jet Vapor Deposition", Jpn. J. Appl. Phys. Vol. 34 (1995) pp.956–958; T. P. Ma. "Making SiN Film a Viable Gate Dielectric", IEEE Transactions on Electron Devices, Vol. 45, No. 3, p. 680 (1998); and U.S. Pat. No. 4,788,082 to Schmidt entitled "Method and Apparatus for the Deposition of Solid Films of a Material from a Jet Stream Entraining the Gaseous Phase of Said Material", all of which are incorporated herein by reference.

A $SrBi_2Ta_2O_9$ (SBT) film, approximately 200 nm thick, was then deposited on top of the oxynitride buffer layer by the spin-on method with MOD (metal organic deposition) solution, and it was subsequently annealed at ~900° C. in oxygen for one hour. This was followed by Au evaporation to form both the gate electrode and the back contact. A postgate anneal was performed at 400° C. in oxygen to complete the fabrication of the FEDRAM gate capacitor.

Figure 4:
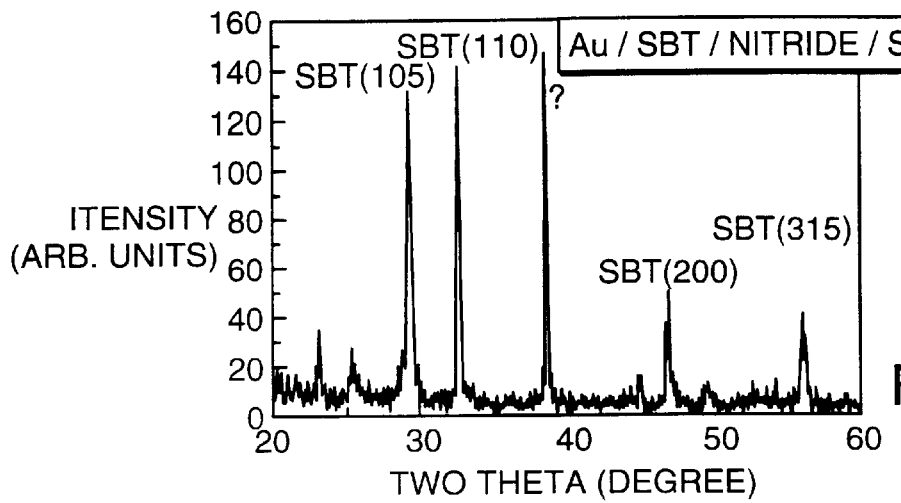
FIG. 4 is an XRD pattern of SBT on Nitride/Si substrate.

FIG. 4 shows the X-ray diffraction pattern of a SBT film formed by the process just described, indicating that the material is polycrystalline.

Figure 5:
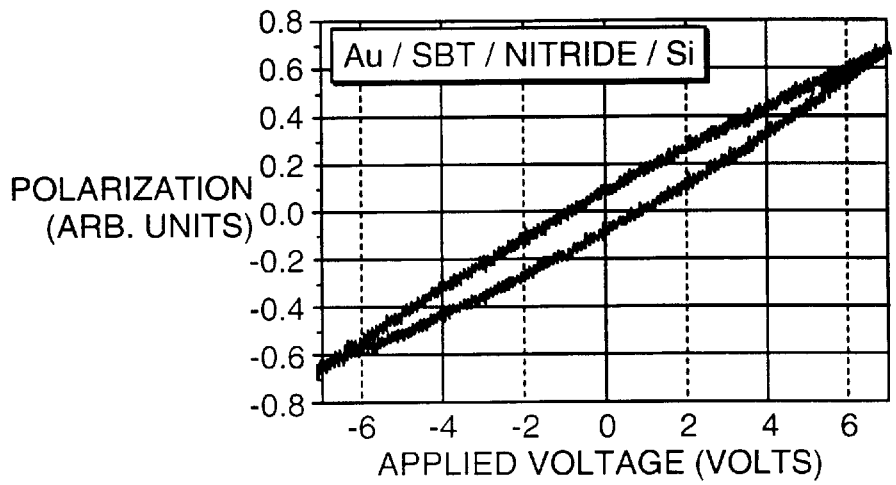
FIG. 5 is a P-E loop measured on the FEDRAM gate capacitor.

FIG. 5 shows the P-E (Polarization-Electric Field) loop measured on a FEDRAM gate, indicating a non-saturating P-E behavior with a relatively small remanent polarization (~0.15 $\mu C/cm^2$).

Figure 6:
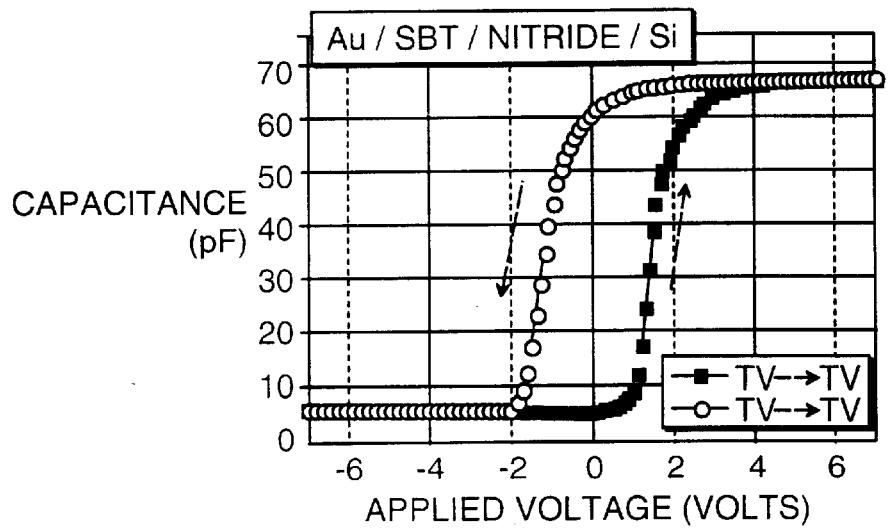
FIG. 6 are C-V curves of a FEDRAM gate capacitor showing hysteresis.

FIG. 6 shows the C-V (Capacitance-Voltage) curves of a representative FEDRAM gate capacitor. Note that the hysteresis is in the counter-clockwise direction, which is the same as that due to the switching of the FE polarization, but opposite to the due to border traps (or slow states). The only other possibility, that due to mobile ions, has been ruled out based on two facts: (1) mobile ions should not cause a positive flatband voltage; and (2) the same hysteresis is observed at sufficiently high ramp rates ($\geq 5V/s$) that mobile ions cannot follow such a rapid voltage sweep.

At first, it may seem surprising that such a small remanent polarization could cause such a large C-V window. In fact, it turns out that one only needs sufficient remanent polarization so that $2P_r$ can cause the underlying semiconductor to go from depletion to inversion (or vice versa). This amount is calculated to be around 0.1 $\mu C/cm^2$. Once this value is exceeded, the remanent polarization has a minor impact on the memory window, and it is the coercive field that largely determines this window.

Figure 7:
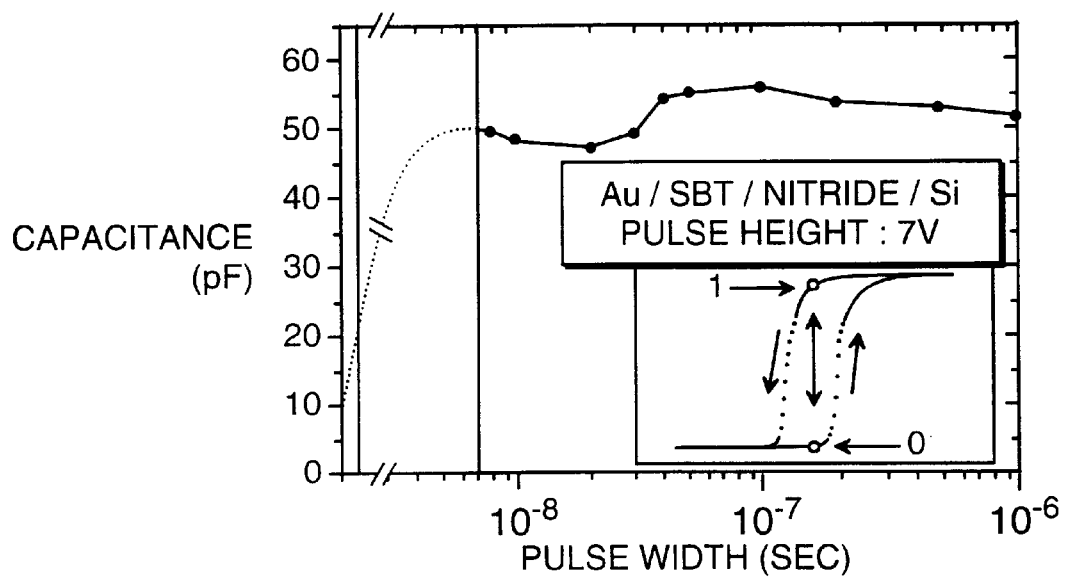
FIG. 7 shows the zero bias capacitance of a FEDRAM gate capacitor after the application of a voltage pulse of various pulse widths.

To investigate the switching speed of the FEDRAM gate capacitor, we applied a "single-shot" voltage pulse across it and then measured the capacitance at zero gate voltage. FIG. 7 shows that, even with a pulse width as short as 8 ns (the shortest pulse available to us at the time of doing these measurements), the switching is basically complete for a pulse height of 7 V.

Figure 8:
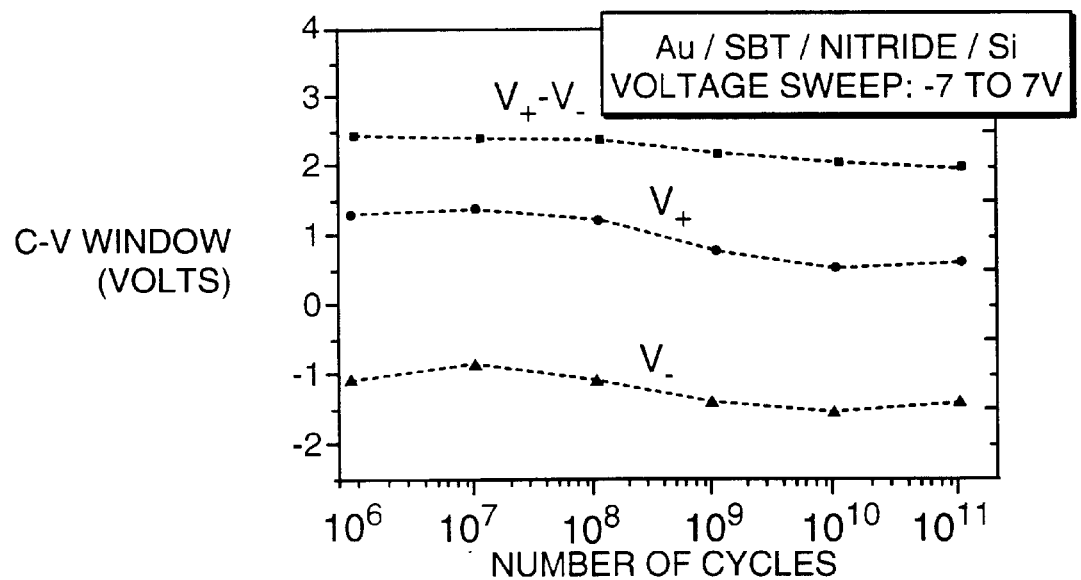
FIG. 8 shows the C-V memory window measured near flatband, as a function of the number of cycles.

FIG. 8 shows the results from a fatigue test. V+ is the flatband voltage after a positive pulse and V− is the flatband voltage after a negative pulse. One can see that the C-V memory window ($V_+ - V_-$) remains practically unchanged after $10^{11}$ cycles of switching, although the window drifted gradually, due probably to the charge trapping in the dielectric.

Figure 9:
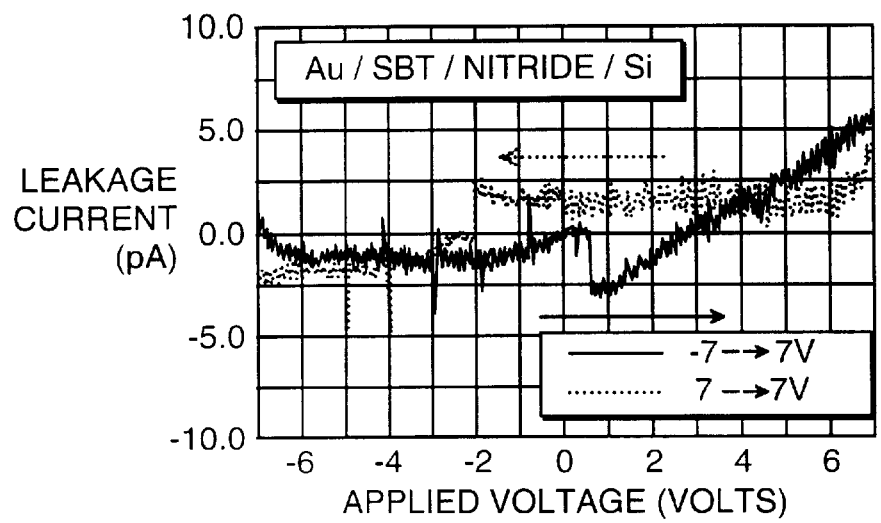
FIG. 9 shows the I-V characteristic measured on a FEDRAM gate capacitor.

We have also measured I-V characteristics, and found that the leakage current never exceeds 10 pA (or 1 $nA/cm^2$) throughout the voltage range (±7v) studies, as shown in FIG. 9.

Figure 10:
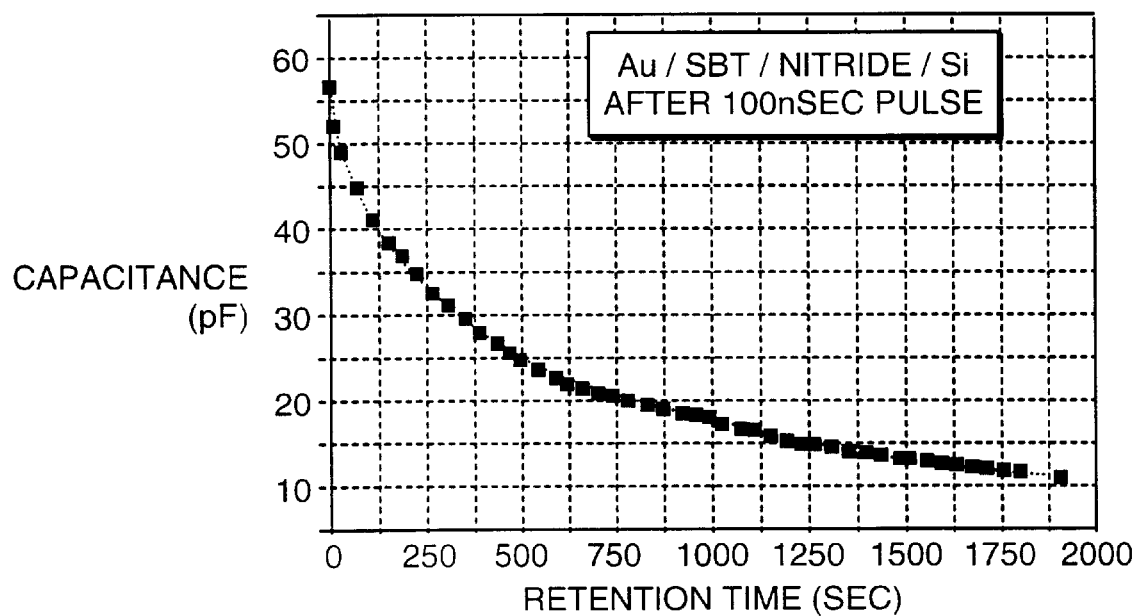
FIG. 10 shows the retention characteristic of a FEDRAM gate capacitor.

FIG. 10 shows the retention characteristics of a typical FEDRAM gate. The data indicate that, after the gate is programmed by a short pulse to achieve a capacitance value of 57 pF, it gradually decays, but still retains more than 50% of its initial value after 5 minutes. Such a long retention time is to be compared to the conventional DRAM cell currently on the market which has a typical retention time of on the order of only about 1 second.

The FEDRAM

Figure 11:
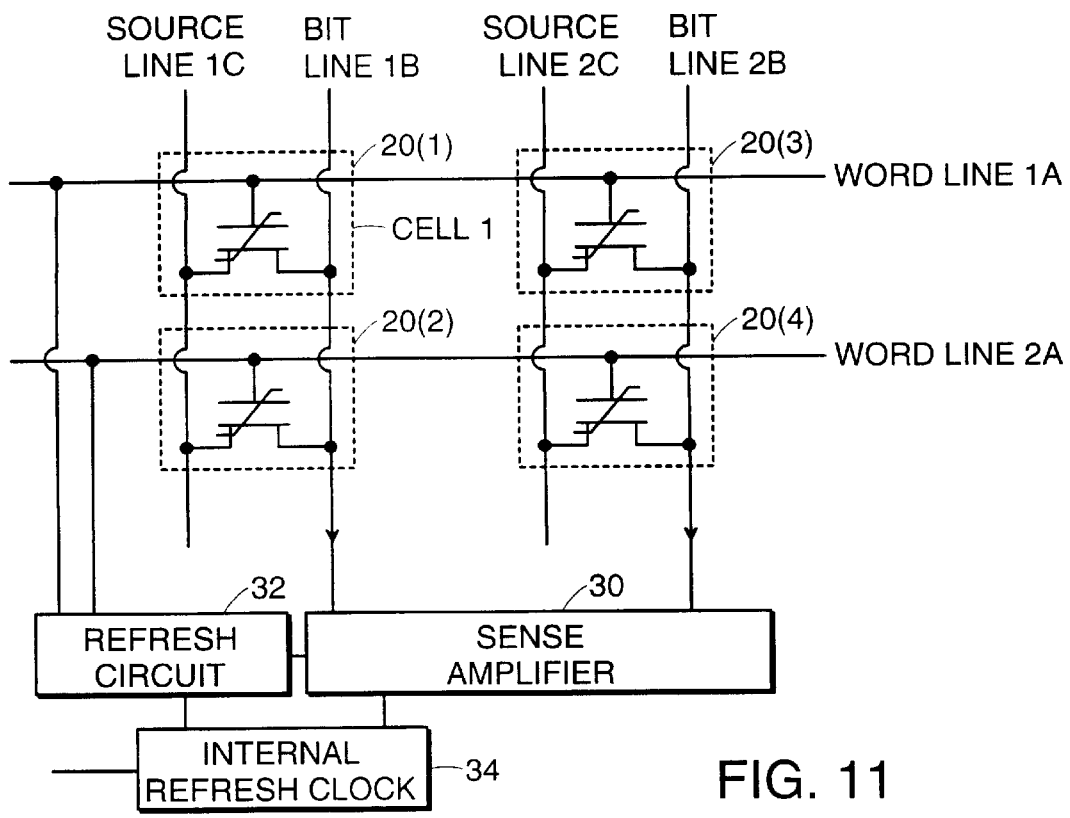
FIG. 11 is a simplified FEDRAM circuit containing 4 memory cells.

FIG. 11 shows a simple example of a FEDRAM which includes an array of four memory cells 20(1–4) with two cells in each of two rows. In general, in a FEDRAM there are n gates in a row and m drains in a column. Each cell includes an FE transistor. The FEDRAM includes sense amplifier circuitry 30, which reads the stored values in the selected cells; refresh circuitry 32, which writes back to each cell the value that is sensed by the sense amplifier circuitry 30; and internal refresh clock circuitry 34 which controls the refresh operation.

Each Word Line in the FEDRAM connects two gates in the same row; each Bit Line connects two drains in the same column; and each Source Line connects two sources in the same column. In the case of an mxn array, each bit line will connect m drains in each column, each Source Line will connect m sources in each column, and each Word Line will connect n gates in each row.

For this discussion, suppose that each memory cell requires a voltage difference of +Vpp between the gate and the source/drain to write a "1", and −Vpp to write a "0". Also suppose that either +½Vpp or −½Vpp does not affect the stored state in a cell. Then, one possible programming scheme for a selected cell (e.g. Cell 1) is as follows. To write a "1" into Cell 1, one applies a positive voltage pulse of magnitude ½Vpp on the Word Line 1A and −½Vpp on the Source Line 1C and Bit Line 1B. All other word lines, bit lines, and source lines are held at ground potential. To write a "0" into a Cell 1, one applies a negative voltage pulse of −½Vpp on the Word Line 1A and +½Vpp on the Source Line 1C and Bit Line 1B. All other word lines, bit lines, and source lines are held at ground potential.

To read the data stored in a selected memory cell (again referring to Cell 1), the Source Line 1C is grounded, the Bit Line 1B is momentarily charged up to +½Vpp, and the Word Line 1A is given the reading voltage Vr, which is sufficiently high to turn on the memory transistor that stores a "1", but not high enough to turn on those that store a "0". At this point, if Cell 1 stores a "1", then the corresponding transistor is turned on, and the Bit Line 1B will discharge to ground. On the other hand, if Cell 1 stores a "0", then the potential on Bit Line 1B will remain near +½Vpp for a while, long enough to be sensed by the sense amplifier and refresh circuits, to be described shortly.

Note that the read operation does not disturb the state stored in the FEDRAM as it does in a conventional DRAM in which the state is stored in a capacitor.

Because the data stored in the FEDRAM transistor will decay over time, refresh circuitry 32 in cooperation with sense amplifier 30 periodically refreshes the stored data. There are many such circuits that have been developed to accomplish this function in conventional DRAM and there are also many alternative designs that could be used to accomplish the same general functionality in the case of the FEDRAM. It is well within the ability of a person of ordinary skill in the art to design circuitry which accomplishes the refresh function. In general, the refresh circuit in cooperation with the sense amplifier senses and latches the stored value in a selected cell by sensing the conductivity between the source and drain of the FEDRAM transistor. The refresh circuit then writes this value back to the FEDRAM transistor by applying the appropriate pulse to the FEDRAM gate relative to the source and drain. The circuits apply the appropriate sequence of signals on the word lines, source lines and bits lines to accomplish this operation for each of the cells in the array.

In the described embodiment, the refresh function is controlled by an internal refresh clock. There are at least two alternative ways to manage the timing of the refresh operation. One way is to automatically refresh all cells after the elapse of a predetermined period of time, which is selected to be short enough so that the stored data does not decay so far that errors will be made in reading the stored values. Alternatively, the sense amplifier can periodically monitor the state of the data stored in the individual cells and when it decays to a certain threshold level, the FEDRAM invokes the refresh operation for that cell (or for all cells at that time).

There are many possible ways known to persons skilled in the art of constructing the sense amplifier/refresh circuitry. The underlying principles of their operation are illustrated by two simple examples given below.

Figure 12:
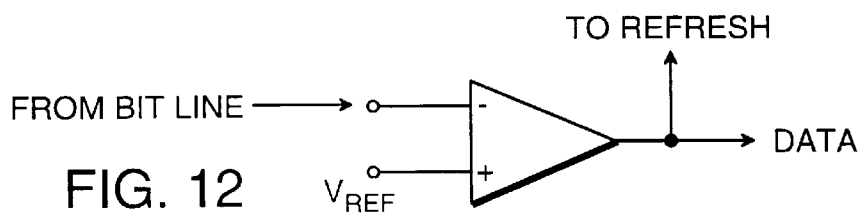
FIG. 12 is a simple sense amplifier and refresh voltage generator circuit.

In FIG. 12, a comparator is utilized for both sensing the data and for generating the voltage used for the refresh. This comparator outputs a +½Vpp when the inverting input voltage is below the reference voltage Vref, and outputs a −½Vpp when the inverting input voltage is above the reference voltage Vref. Let's select Vref to be some voltage between +½Vpp and 0; say +½Vpp. In this case, if Cell 1 stores a "1" when the reading voltage Vr is applied to the Word Line 1A, the potential on Bit Line 1B is pulled down to nearly zero, and the output from the sense amplifier will therefore be +½Vpp, or "High". On the other hand, if Cell 1 stores a "0", the potential on Bit Line 1B remains near +½Vpp, and the output from the sense amplifier will be −½Vpp, or "Low". Note that the output voltage of the comparator can be fed back to refresh Cell 1 by the use of the programming procedure described above.

Figure 13:
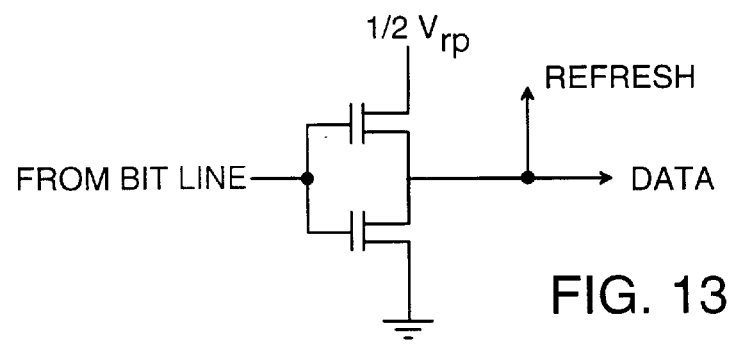
FIG. 13 is a CMOS inverter sense amplifier circuit.

Another example of a sensing amplifier circuit is shown in FIG. 13, in which a CMOS inverter is used. Again we assume that the Cell 1 in FIG. 11 is selected, and Vr is applied to the Word Line 1A. If Cell 1 stores a "1", Bit Line 1B will be "Low" as described previously, and the output of the CMOS Inverter in FIG. 13 will be "High" (corresponding to a "1"). On the other hand, if Cell 1 stores a "0", Bit Line 1B will be "High", and the output of the CMOS inverter will be "Low" (corresponding to a "0"). Note that the output of the CMOS inverter can be fed back to refresh Cell 1.

Figure 14:
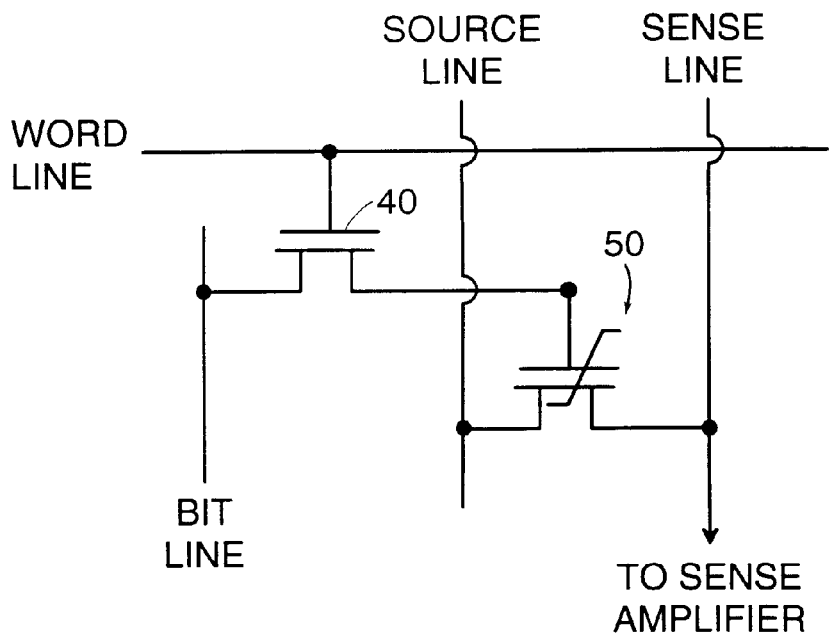
FIG. 14 is a circuit diagram of a memory cell with a select transistor.

To alleviate possible problems arising from program disturb, read disturb, or refresh disturb, a select transistor 40 (or access transistor) may be added to each cell, as shown in FIG. 14. the select transistor can be a regular MOSFET without the ferroelectric film. The select transistor is turned "on" or "off" by applying an appropriate voltage on the corresponding Word Line, and its "on" and "off" serves to connect or disconnect the Bit Line to the gate of the selected FE memory transistor 50. The programming operation is as follows. First, a particular cell is selected by turning on the corresponding select transistor, which connects the Bit Line to the ferroelectric gate. If the bit line is "High", a "1" is written into the storage transistor, whereas if the bit line is "Low" a "0" is written. In some sense, this arrangement is very similar to the conventional DRAM cell arrangement, except that the storage capacitor is replaced by the FE transistor. The sense amplifier schemes shown in FIGS. 13 and 14, when properly modified, should be applicable in this case as well.

Figure 15:
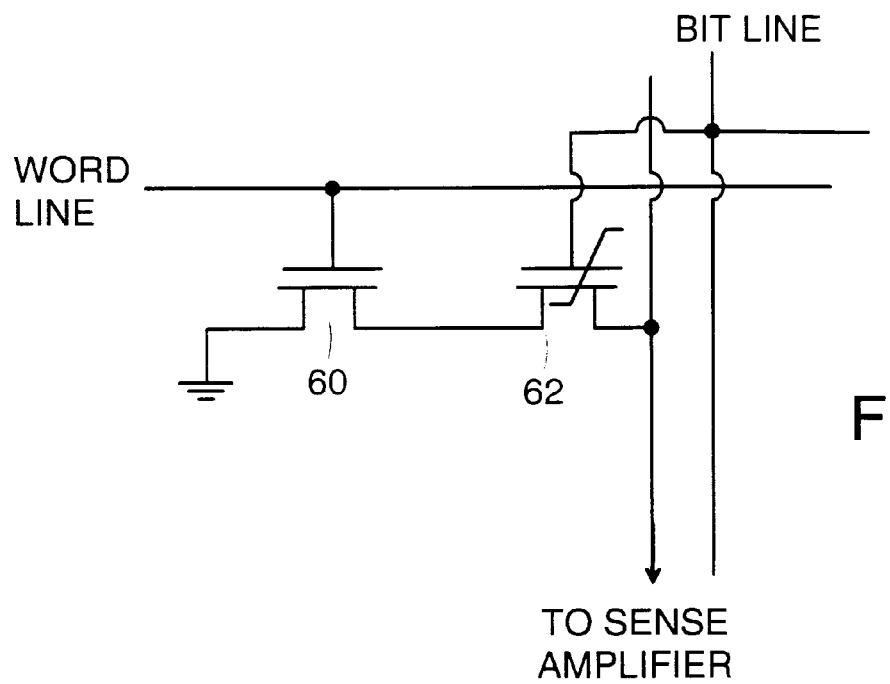
FIG. 15 is an alternative memory cell design using a select transistor.

Another configuration for insertion of a select transistor is shown in FIG. 15. In this case, the select transistor 60 serves to connect or disconnect the current path for the memory transistor 62, as employed in some EEPROM arrays.

Figure 16:
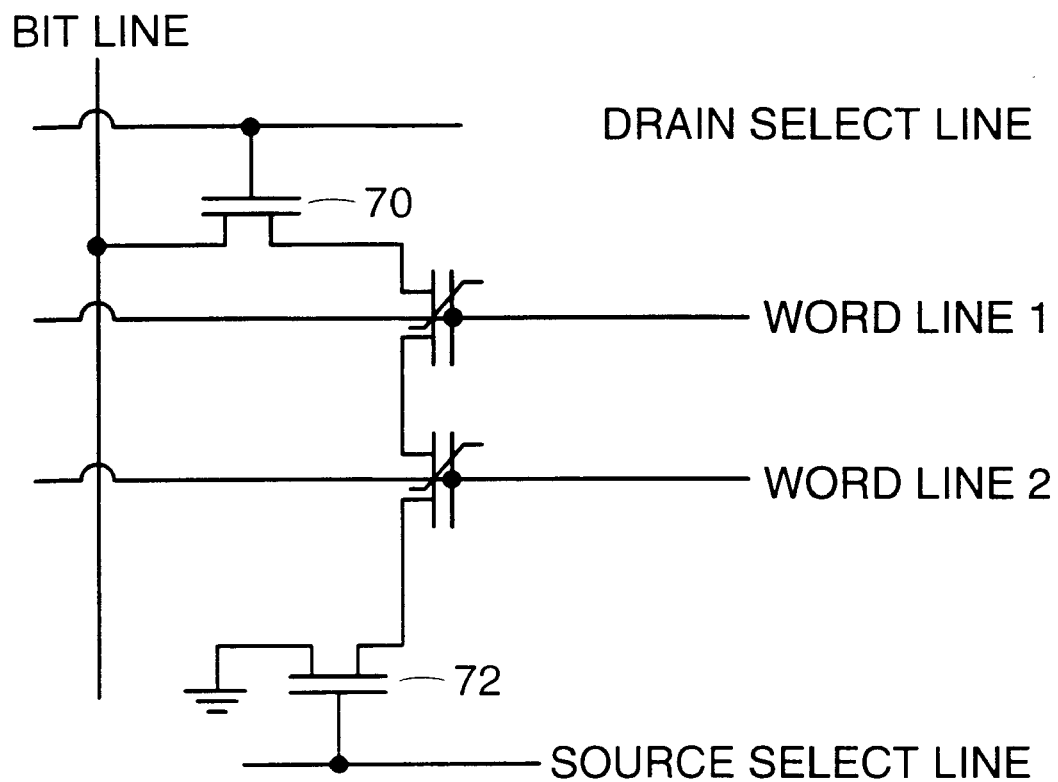
FIG. 16 is a two cell column of a NAND memory array which employs the FEDRAM.

The array shown in FIG. 11 (or its counterpart with a select transistor added) is known as the "NOR" architecture. One may also arrange the memory cells in a so-called "NAND" array, as shown in FIG. 16, where only one column is shown, in which a drain select transistor is shown on the top and a source select transistor 72 is shown on the bottom. The memory cells have their sources and drains connected in series. The programming and read operations are similar to those used in NAND EEPROM cells, and those skilled in the art should know how to do them. The sense amplifier examples shown in FIGS. 3 and 4 can also be applied in this case.

The invention is meant to cover all of the above-mentioned alternative approaches as well as others not specifically mentioned. The above-mentioned embodiments and others are within the following claims.

What is claimed is:

1. A memory comprising:

an array of volatile memory cells, each of which includes as its memory element a ferroelectric field effect transistor (FET) which stores information in a polarization state that decays over time; and sense and refresh circuitry connected to the array of volatile memory cells and which during operation repeatedly reads stored data within each cell by sensing source-to-drain conductivity of the ferroelectric transistor and refreshes the stored data by restoring the ferroelectric Polarization state of the ferroelectric FETs of each cell.

2. The memory of claim 1 wherein said sense and refresh circuitry is programmed to periodically refresh the stored data in the array of memory cells.

3. The memory of claim 1 wherein said sense and refresh circuitry is programmed to periodically sense the stored data in a selected one of the memory cells and if the sensed data in the selected memory cell has decayed to below a threshold value to automatically refresh the data stored in the selected memory cell.

4. The memory of claim 1 wherein each memory cell in the array of memory cells further comprises a select transistor connected to the ferroelectric FET in that memory cell.

5. The memory of claim 4 wherein in each memory cell in the array of memory cells, the select transistor is connected to a gate of the ferroelectric FET in that memory cell.

6. The memory of claim 4 wherein in each memory cell in the array of memory cells, the select transistor is connected to one of a source and drain of the ferroelectric FET in that memory cell.

7. The memory of claim 1 wherein in each memory cell of the array of memory cells, the ferroelectric transistor includes a gate dielectric made of ferroelectric material.

8. The memory of claim 1 wherein in each memory cell of the array of memory cells, the ferroelectric transistor includes a gate dielectric stack made up of a layer of ferroelectric material and a layer of dielectric material.

9. The memory of claim 8 wherein in each memory cell of the array of memory cells, the layer of dielectric material lies between the ferroelectric material and a channel region in the ferroelectric transistor.

10. The memory of claim 1 wherein in each memory cell of the array of memory cells, the ferroelectric transistor includes a gate dielectric stack made up of a layer of ferroelectric material and first and second layers of dielectric material.

11. The memory of claim 10 wherein in each memory cell of the array of memory cells, the ferroelectric material is sandwiched between the first and second layers of dielectric material.

12. The memory of claim 1 wherein said sense and refresh circuitry is structured to non-destructively read stored data within each cell by sensing source-to-drain conductivity of the ferroelectric transistor.

13. A DRAM comprising:

an array of volatile memory cells, each of which includes a ferroelectric field effect transistor (FET) as its memory element and which stores information as a ferroelectric polarization state, wherein the DRAM determines a stored value within any given memory cell by non-destructively sensing source-to-drain conductivity of the corresponding ferroelectric FET, and wherein the memory elements are volatile because the ferroelectric polarization state decays.

14. The DRAM of claim 13 wherein the determination of the stored value within any given memory cell is done non-destructively.

* * * * *